(12) United States Patent
Penney et al.

(10) Patent No.: US 10,832,792 B1
(45) Date of Patent: Nov. 10, 2020

(54) APPARATUSES AND METHODS FOR ADJUSTING VICTIM DATA

(71) Applicant: MICRON TECHNOLOGY, INC., Boise, ID (US)

(72) Inventors: Daniel B. Penney, Wylie, TX (US); Jason M. Brown, Allen, TX (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/459,507

(22) Filed: Jul. 1, 2019

(51) Int. Cl.
*G11C 7/00* (2006.01)
*G11C 29/00* (2006.01)
*G11C 11/408* (2006.01)
*G11C 11/406* (2006.01)

(52) U.S. Cl.
CPC ........ *G11C 29/783* (2013.01); *G11C 11/4085* (2013.01); *G11C 11/40603* (2013.01); *G11C 11/40607* (2013.01)

(58) Field of Classification Search
CPC ............ G11C 29/783; G11C 11/40603; G11C 11/40607; G11C 11/4085

USPC ........................................................ 365/222
See application file for complete search history.

(56) References Cited

U.S. PATENT DOCUMENTS

| 2013/0107623 | A1* | 5/2013 | Kavalipurapu | G11C 16/28 365/185.03 |
|---|---|---|---|---|
| 2016/0099043 | A1* | 4/2016 | Tu | G11C 11/40615 365/222 |
| 2016/0211008 | A1* | 7/2016 | Benedict | G06F 3/0619 |

* cited by examiner

*Primary Examiner* — Vu A Le
(74) *Attorney, Agent, or Firm* — Dorsey & Whitney LLP

(57) ABSTRACT

Addresses of accessed word lines are stored. Data related to victim word lines associated with the accessed word line are also stored. The victim word lines may have data stored in relation to multiple accessed word lines. The data related to the victim word lines is adjusted when the victim word line is refreshed during a targeted refresh operation or an auto-refresh operation. The data related to the victim word lines is adjusted when the victim word line is accessed during a memory access operation.

20 Claims, 6 Drawing Sheets

APPARATUSES AND METHODS FOR ADJUSTING VICTIM DATA

BACKGROUND

This disclosure relates generally to semiconductor devices, and more specifically to semiconductor memory devices. In particular, the disclosure relates to volatile memory, such as dynamic random access memory (DRAM). Information may be stored on individual memory cells of the memory as a physical signal (e.g., a charge on a capacitive element). The memory may be a volatile memory, and the physical signal may decay over time (which may degrade or destroy the information stored in the memory cells). It may be necessary to periodically refresh the information in the memory cells by, for example, rewriting the information to restore the physical signal to an initial value.

As memory components have decreased in size, the density of memory cells has greatly increased. Typically, memory cells are arranged in an array that includes a series of rows referred to as word lines and columns referred to as bit lines. An auto-refresh operation may be carried out where the memory cells of one or more word lines are periodically refreshed to preserve data stored in the memory cells. Repeated access to a particular memory cell or group of memory cells, such as a word line, may cause an increased rate of data degradation in nearby memory cells (e.g., adjacent word lines). This repeated access is often referred to as a 'row hammer.' To preserve the data in nearby memory cells, the word lines of the nearby memory cells may need to be refreshed at a rate higher than a rate of the auto-refresh operations.

DETAILED DESCRIPTION

Figure 1:
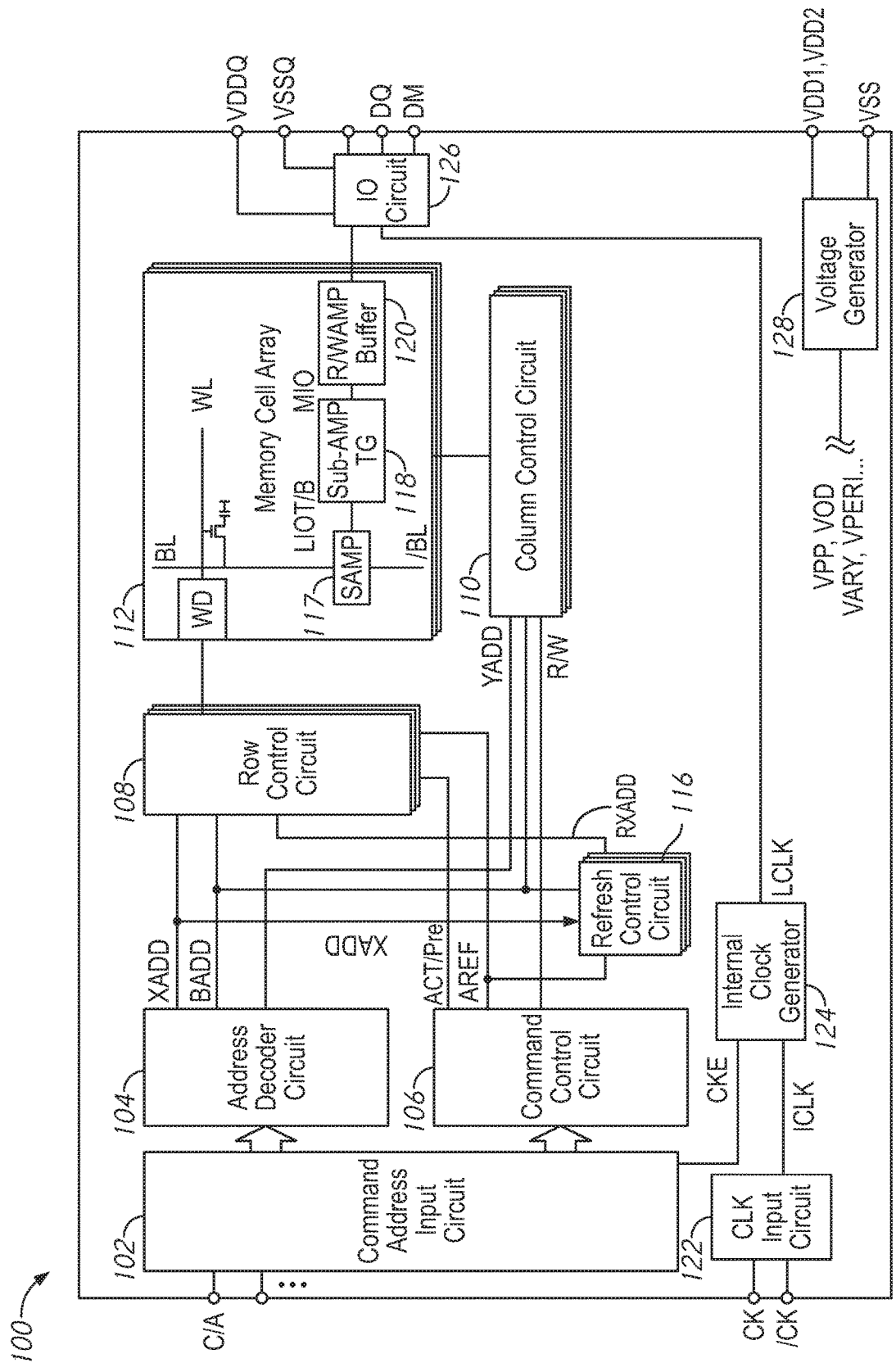
FIG. 1 is a block diagram of a semiconductor device according to an embodiment of the present disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

A memory device may include an array of memory cells. The memory cells may store information (e.g., as one or more bits), and may be organized at the intersection of word lines (rows) and bit lines (columns). A number of word lines and bit lines may be organized into a memory bank. The memory device may include a number of different memory banks. The memory device may receive one or more command signals which may indicate operations in one or more of the banks of one or more memory packages. The memory device may enter a refresh mode, in which word lines in one or more of the memory banks are refreshed.

Information in the memory cells may decay over time. The memory cells may be refreshed on a row-by-row (e.g., word line-by-word line) basis to preserve information in the memory cells. During a refresh operation, the information in one or more rows may be rewritten back to the respective word line to restore an initial value of the information. Repeated access to a given word line (e.g., an aggressor word line) may cause an increased rate of information decay in one or more physically neighboring word lines (e.g., victim word lines). In some applications, victim word lines may be considered to be the word lines which are physically adjacent to the aggressor word line. For example, victim word lines may be located on either side of the aggressor word line (e.g., R+1 and R−1). In some embodiments, the word lines which are adjacent to the adjacent word lines (e.g., R+2 and R−2) may also be treated as victim word lines. Thus, in some embodiments, there may be four victim addresses for each aggressor address. In some applications, such as memories where word lines are densely spaced, more distant word lines may be considered victim word lines (e.g., R+3, R−3, R+4, R−4, etc.).

Accesses to different word lines of the memory may be tracked in order to determine if a word line is an aggressor word line. The row address of the accessed word lines and/or aggressor word lines may be stored in a register or other storage device in the memory. If a word line is determined to be an aggressor word line, victim word lines may be determined based, at least in part, on a row address of the aggressor word line. In some embodiments, the victim word lines (e.g., R+1, R−1, R+2, and R−2) may be refreshed as part of a targeted (or 'row hammer') refresh operation. The targeted refresh operation for preserving data in the victim word lines may also be referred to as 'healing' the victim word lines. Targeted refresh operations may preserve data in victim word lines, but the targeted refresh operations may steal timeslots which would otherwise be used for auto-refresh operations, thus decreasing the rate of auto-refresh operations. As the auto-refresh rate is reduced by targeted refresh operations, data degradation could occur in memory cells unaffected by the row hammer. Increasing the auto-refresh rate to compensate for the targeted refreshes may cause the memory to use more power and/or increase delays between memory access operations (e.g., read, write). Accordingly, reducing unnecessary targeted refresh operations is desired.

Although the accessed word line associated with the victim word lines is referred to as an aggressor word line, it may be only a suspected aggressor word line and/or a word line treated as an aggressor word line for preemptive healing of victim word lines. However, for simplicity, any word line associated with victim word lines and/or word lines refreshed during a targeted refresh operation may be referred to herein as an aggressor word line.

While accesses to different word lines are tracked, data related to the victim word lines associated with the accessed word lines often is not. When information about the individual victim word lines is not tracked, it may not be possible to distinguish which victim word lines have been refreshed. Thus, all of the victim word lines associated with the aggressor word line may be provided for refreshing together to ensure that all of the victim word lines are refreshed. In some applications, this may require refreshing four word lines (e.g., R+1, R−1, R+2, R−2), which may require 'stealing' four or more refreshes from the auto-refresh operation. It may be desirable to reduce the number of unnecessary targeted refresh operations to reduce the impact on the auto-refresh rate (e.g., increase the period between the periodic targeted refresh operations) and/or power consumption by a memory device.

In some memories with row hammer management capabilities, row addresses associated with accessed word lines may be stored. Additionally, data for victim word lines associated with the accessed word lines may be stored and associated with the stored row addresses.

Just as an aggressor word line may have multiple victims, a victim word line may be a victim of more than one aggressor word line. For example, if a pair of word lines are separated from each other by a single word line, the word line in between may be a victim word line of both of the neighboring word lines. Thus, a victim word line may be associated with victim data for multiple accessed row addresses. Accordingly, the victim word line may be refreshed multiple times based on the victim word line's association with the multiple accessed row addresses. However, the victim word line may not need to be refreshed multiple times. That is, the victim word line may undergo unnecessary refresh operations due to the "duplicate" victim data associated with different accessed row addresses.

Furthermore, a word line that is a victim may also be an accessed word line. Accessing the word line causes the data stored in the word line to be retrieved and rewritten to the word line. Thus, similar to a refresh operation, accessing the word line "heals" the data stored in the word line. Accordingly, after being accessed, a victim word line may not need to be refreshed by a targeted refresh operation to preserve the data.

The present disclosure is drawn to apparatuses and methods for adjusting the victim word line data associated with accessed row addresses. An apparatus may include a "reverse scrambler" that receives a refresh address or accessed row address and calculates row addresses for word lines that could be aggressor word lines to the word line associated with the refresh address or accessed row address. In other words, the reverse scrambler may calculate row addresses for all of the word lines that could cause the word line corresponding to a refresh address or accessed row address to become a victim word line. Victim data for the calculated row addresses may be adjusted such that the victim data reflects the 'healing' of the victim word lines (e.g., preserving the data stored in the word line) by one or more mechanisms (e.g., targeted refresh, auto-refresh, access). Adjusting the victim data as described herein may reduce the number of unnecessary refresh operations in some applications.

FIG. 1 is a block diagram showing an overall configuration of a semiconductor device according to at least one embodiment of the disclosure. The semiconductor device 100 may be a semiconductor memory device, such as a DRAM device integrated on a single semiconductor chip.

The semiconductor device 100 includes a memory array 112. In some embodiments, the memory array 112 may include of a plurality of memory banks. Each memory bank includes a plurality of word lines WL, a plurality of bit lines BL and /BL, and a plurality of memory cells MC arranged at intersections of the plurality of word lines WL and the plurality of bit lines BL and /BL. The selection of the word line WL is performed by a row control circuit 108 and the selection of the bit lines BL and BL is performed by a column control circuit 110. In some embodiments, there may be a row control circuit 108 and column control circuit 110 for each of the memory banks.

The bit lines BL and /BL are coupled to a respective sense amplifier (SAMP) 117. Read data from the bit line BL or /BL is amplified by the sense amplifier SAMP 117, and transferred to read/write amplifiers 120 over complementary local data lines (LIOT/B), transfer gate (TG) 118, and complementary main data lines (MIO). Conversely, write data outputted from the read/write amplifiers 120 is transferred to the sense amplifier 117 over the complementary main data lines MIO, the transfer gate 118, and the complementary local data lines LIOT/B, and written in the memory cell MC coupled to the bit line BL or BL.

The semiconductor device 100 may employ a plurality of external terminals that include command and address (C/A) terminals coupled to a command and address bus to receive commands and addresses, clock terminals to receive clocks CK and /CK, data terminals DQ to provide data, and power supply terminals to receive power supply potentials VDD, VSS, VDDQ, and VSSQ.

The clock terminals are supplied with external clocks CK and /CK that are provided to a clock input circuit 122. The external clocks may be complementary. The clock input circuit 122 generates an internal clock ICLK based on the CK and /CK clocks. The ICLK clock is provided to the command control circuit 106 and to an internal clock generator circuit 124. The internal clock generator circuit 124 provides various internal clocks LCLK based on the ICLK clock. The LCLK clocks may be used for timing operation of various internal circuits. The internal data clocks LCLK are provided to the input/output circuit 126 to time operation of circuits included in the input/output circuit 126, for example, to data receivers to time the receipt of write data.

The C/A terminals may be supplied with memory addresses. The memory addresses supplied to the C/A terminals are transferred, via a command/address input circuit 102, to an address decoder circuit 104. The address decoder circuit 104 receives the address and supplies a decoded row address XADD to the row control circuit 108 and supplies a decoded column address YADD to the column control circuit 110. The row address XADD may be used to specify one or more word lines WL of the memory array 112 and the column address YADD may specify one or more bit lines BL of the memory array 112. The address decoder circuit 104 may also provide a bank address BADD, which specifies a particular bank of the memory. The bank address BADD may be provided to the row control circuit 108 and/or column control circuit 110 to direct access operations to one or more of the banks. The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and/or bank address BADD to indicate the memory cell(s) to be accessed.

The commands may be provided as internal command signals to a command control circuit 106 via the command/address input circuit 102. The command control circuit 106 includes circuits to decode the internal command signals to generate various internal signals and commands for performing operations. For example, the command control circuit 106 may provide a row command signal to select a word line and a column command signal to select a bit line.

The device 100 may receive an access command which is a row activation command ACT. When the row activation command ACT is received, a row address XADD is timely supplied with the row activation command ACT.

The device 100 may receive an access command which is a read command. When a read command is received, a bank address BADD and a column YADD address are timely supplied with the read command, read data is read from memory cells in the memory array 112 corresponding to the row address XADD and column address YADD. The read command is received by the command control circuit 106, which provides internal commands so that read data from the memory array 112 is provided to the read/write amplifiers 120. The read data is output to outside from the data terminals DQ via the input/output circuit 126.

The device 100 may receive an access command which is a write command. When the write command is received, a bank address and a column address are timely supplied with the write command, write data supplied to the data terminals DQ is written to a memory cells in the memory array 112 corresponding to the row address and column address. The write command is received by the command control circuit 106, which provides internal commands so that the write data is received by data receivers in the input/output circuit 126. Write clocks may also be provided to the external clock terminals for timing the receipt of the write data by the data receivers of the input/output circuit 126. The write data is supplied via the input/output circuit 126 to the read/write amplifiers 120, and by the read/write amplifiers 120 to the memory array 112 to be written into the memory cell MC.

The device 100 may also receive commands causing it to carry out refresh operations. A refresh signal AREF may be a pulse signal which is activated when the command control circuit 106 receives a signal which indicates a refresh mode. In some embodiments, the refresh command may be externally issued to the memory device 100. In some embodiments, the refresh command may be periodically generated by a component of the device. In some embodiments, when an external signal indicates a refresh entry command, the refresh signal AREF may also be activated. The refresh signal AREF may be activated once immediately after command input, and thereafter may be cyclically activated at desired internal timing. Thus, refresh operations may continue automatically. A self-refresh exit command may cause the automatic activation of the refresh signal AREF to stop and return to an IDLE state.

The refresh control circuit 116 supplies a refresh row address RXADD to the row control circuit 108, which may refresh one or more word lines WL indicated by the refresh row address RXADD. The refresh control circuit 116 may control a timing of the refresh operation based on the refresh signal AREF. In some embodiments, responsive to an activation of AREF, the refresh control circuit 116 may generate one or more activations of a pump signal, and may generate and provide a refresh address RXADD for each activation of the pump signal (e.g., each pump).

One type of refresh operation may be an auto-refresh operation. Responsive to an auto-refresh operation, the memory bank may refresh a word line or a group of word lines of the memory, and then may refresh a next word line or group of word lines of the memory bank responsive to a next auto-refresh operation. The refresh control circuit 116 may provide an auto-refresh address as the refresh address RXADD which indicates a word line or a group of word lines in the memory bank. The refresh control circuit 116 may generate a sequence of refresh addresses RXADD such that over time the auto-refresh operation may cycle through all the word lines WL of the memory bank. The timing of refresh operations may be such that each word line is refreshed with a frequency based, at least in part, on a normal rate of data degradation in the memory cells (e.g., auto-refresh rate).

Another type of refresh operation may be a targeted refresh operation. As mentioned previously, repeated access to a particular word line of memory (e.g., an aggressor word line) may cause an increased rate of decay in neighboring word lines (e.g., victim word lines) due, for example, to electromagnetic coupling between the word lines. In some embodiments, the victim word lines may include word lines which are physically adjacent to the aggressor word line. In some embodiments, the victim word lines may include word lines further away from the aggressor word line. Information in the victim word line may decay at a rate such that data may be lost if they are not refreshed before the next auto-refresh operation of that word line. In order to prevent information from being lost, it may be necessary to identify aggressor word lines and then carry out a targeted refresh operation where a refresh address RXADD associated with one or more associated victim word lines is refreshed.

The refresh control circuit 116 may selectively output a targeted refresh address (e.g., a victim row address) or an automatic refresh address (e.g., auto-refresh address) as the refresh address RXADD. The auto-refresh addresses may be from a sequence of addresses which are provided based on activations of the auto-refresh signal AREF. The refresh control circuit 116 may cycle through the sequence of auto-refresh addresses at a rate determined by AREF. In some embodiments, the sequence of auto-refresh addresses may be generated by updating (e.g., incrementing) one or more portions of the previous auto-refresh address.

The refresh control circuit 116 may also determine targeted refresh addresses which are addresses that require refreshing (e.g., victim row addresses corresponding to victim word lines) based on the access pattern of nearby addresses (e.g., aggressor row addresses corresponding to aggressor word lines) in the memory array 112. The refresh control circuit 116 may selectively use one or more signals of the device 100 to calculate the refresh address RXADD. For example, the refresh address RXADD may be calculated based on the row addresses XADD provided by the address decoder circuit 104. The refresh control circuit 116 may receive the current value of the row address XADD provided by the address decoder circuit 104 and determine a targeted refresh address based on one or more of the received addresses.

The refresh address RXADD may be provided with a timing based on a timing of the refresh signal AREF. The refresh control circuit 116 may have time slots corresponding to the timing of AREF, and may provide one or more refresh addresses RXADD during each time slot. In some embodiments, a targeted refresh address may be issued in a time slot which would otherwise have been assigned to an auto-refresh address (e.g., "steal"). In some embodiments, certain time slots may be reserved for targeted refresh addresses. These time slots may be referred to as targeted refresh time slots. The time period between time slots reserved for targeted refresh addresses may be referred to as the targeted refresh rate or steal rate. As the number of time slots assigned to targeted refreshes increases, the steal rate increases, and the effective auto-refresh rate decreases. In some embodiments, the number of time slots assigned to targeted refreshes is constant. In some embodiments, the refresh control circuit 116 may determine whether to provide a targeted refresh address, not provide an address during that time slot, or provide an auto-refresh address instead during the time slot. Thus, in some embodiments, the steal rate may not be constant over time.

The refresh control circuit 116 may receive the row addresses XADD provided by the address decoder circuit 104 and may determine which word lines are being hammered based on the row addresses XADD. The refresh control circuit 116 may count accesses to the word lines based on the row address XADD and may determine which word lines are aggressors based on the count of the accesses (e.g., reach a threshold value). The row addresses XADD and access count values may be stored by the refresh control circuit 116. In some embodiments, the refresh control circuit 116 may further store victim data associated with victim word lines associated with the word line corresponding to the row address XADD. For example, a flag for R+1, R-1, R+2, and/or R-2 may be stored. These may be referred to as victim flags. When the row address XADD is stored, the victim data may be set to a first value (e.g., the victim flags may be set to a first logic level). In some embodiments, once a victim word line has been refreshed (e.g., healed), the victim data associated with that victim word line may be set to a second value (e.g., the victim flag may be set to a second logic level).

In some embodiments, when an access count value reaches a threshold value, one or more victim row addresses associated with victim word lines of the word line associated with the row address XADD may be calculated by the refresh control circuit 116. The victim row addresses calculated may be based, at least in part, on the victim data. For example, if the access count value reaches a threshold value, and victim data for all of the victim rows are equal to the first value, all victim row addresses corresponding to word lines that are victims of the word line associated with the row address XADD may be determined. In another example, if only some of the victim data is equal to the first value, only the victim row addresses corresponding to word lines associated with the victim data equal to the first value are determined. Victim row addresses for victim data equal to the second state may not be determined. In some embodiments, the victim row address may be provided to a targeted address queue for refreshing during targeted refresh time slots (e.g., sequential targeted refresh time slots). After refreshing the victim word lines, the victim data associated with those word lines may be set to the second value. Continuing this example, the access count value associated with the row address XADD may be reduced or reset (e.g., set to zero).

In some embodiments, the refresh control circuit 116 may determine if victim word lines have been 'healed' by targeted refreshes, auto-refreshes, and/or a memory access operation (e.g., read, write) and adjust victim data associated with the victim word line accordingly. For example, in some embodiments, the refresh control circuit 116 may calculate aggressor row addresses based on the refresh address RXADD and/or row address XADD. The aggressor row addresses may correspond to aggressor word lines of a victim word line associated with the refresh address RXADD or row address XADD. The calculated aggressor row addresses may be compared to the stored row addresses. If one or more matches is found amongst the stored row addresses, the victim data corresponding to the word line associated with RXADD and/or XADD may be set to the second (e.g., healed) value. In some embodiments, an auto-refresh address and/or XADD may be compared to victim data, such as victim row addresses in a queue to be refreshed. If one of the victim row addresses matches the auto-refresh address and/or XADD, the victim row address is removed from the queue. Thus, the removed victim row address will not be refreshed in a targeted refresh operation. Accordingly, the word line associated with RXADD and XADD may not be refreshed multiple times due to its association with multiple aggressor word lines or when it is healed by other mechanisms (e.g., access operation, auto-refresh).

The power supply terminals are supplied with power supply potentials VDD and VSS. The power supply potentials VDD and VSS are supplied to an internal voltage generator circuit 128. The internal voltage generator circuit 128 generates various internal potentials VPP, VOD, VARY, VPERI, and the like based on the power supply potentials VDD and VSS supplied to the power supply terminals. The internal potential VPP is mainly used in the row decoder circuit 108, the internal potentials VOD and VARY are mainly used in the sense amplifiers SAMP included in the memory array 118, and the internal potential VPERI is used in many peripheral circuit blocks.

The power supply terminals are also supplied with power supply potentials VDDQ and VSSQ. The power supply potentials VDDQ and VSSQ are supplied to the input/output circuit 126. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 126 does not propagate to the other circuit blocks.

Figure 2:
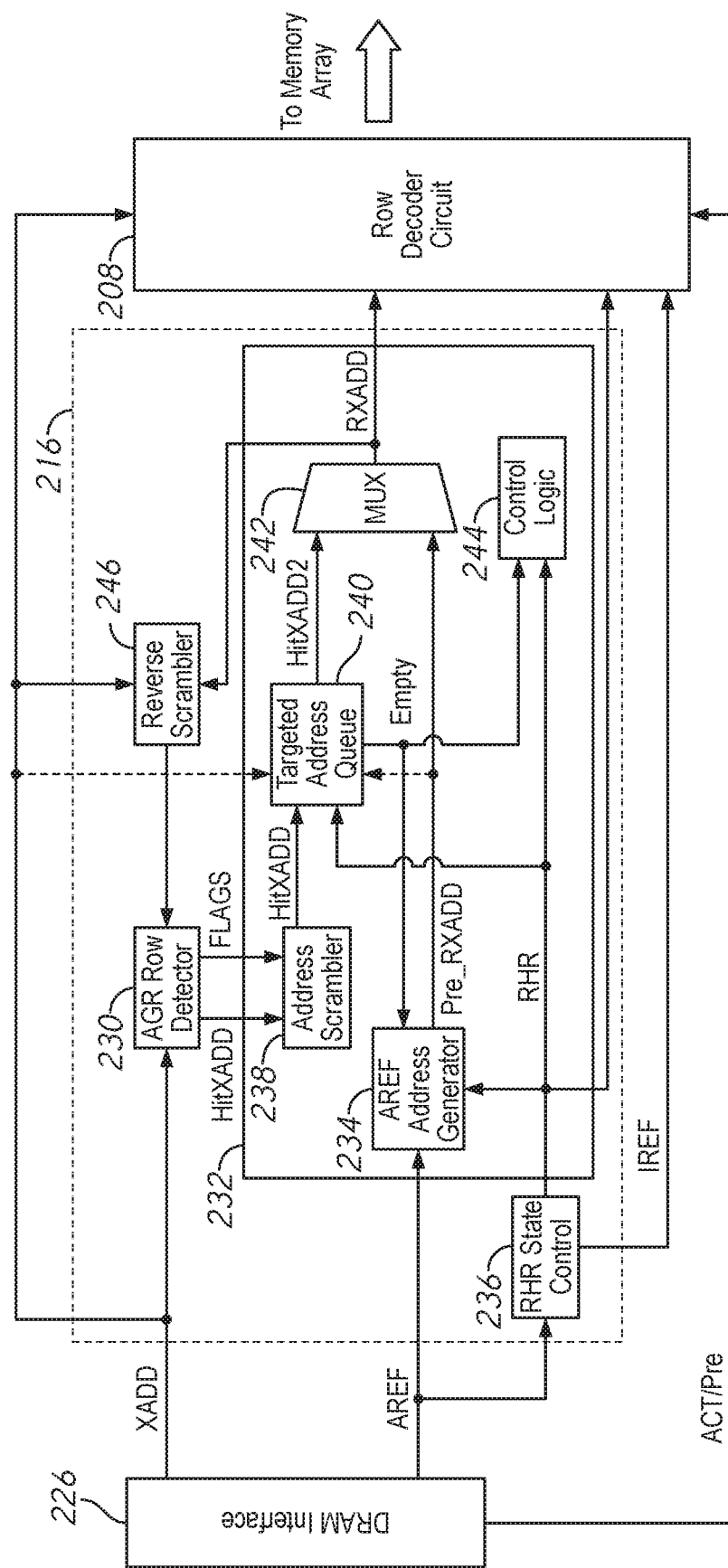
FIG. 2 is a block diagram of a refresh control circuit according to an embodiment of the present disclosure.

FIG. 2 is a block diagram of a refresh control circuit according to an embodiment of the present disclosure. In some embodiments, some or all of the components (e.g., the refresh control circuit 216 and row decoder circuit 208) may correspond to a particular bank of memory, and these components may be repeated for each of the banks of memory. Thus, there may be multiple refresh control circuits 216 and row decoder circuits 208 in some embodiments. For the sake of brevity, only components for a single bank will be described. In some embodiments, refresh control circuit 216 may be included in refresh control circuit 116 shown in FIG. 1. In some embodiments, row decoder circuit 208 may be included in row control circuit 108.

A DRAM interface 226 may provide one or more signals to an address refresh control circuit 216 and row decoder circuit 208. The refresh control circuit 216 may include an aggressor row detector circuit 230 (e.g., AGR row detector), a row hammer refresh (RHR) state control 236, a refresh address generator 234, and a reverse scrambler 246. The DRAM interface 226 may provide one or more control signals, such as an auto-refresh signal AREF, and a row address XADD.

The DRAM interface 226 may represent one or more components which provides signals to components of the bank 218. In some embodiments, the DRAM interface 226 may represent a memory controller coupled to the semiconductor memory device (e.g., device 100 of FIG. 1). In some embodiments, the DRAM interface 226 may represent components such as the command address input circuit 102, the address decoder circuit 104, and/or the command control circuit 106 of FIG. 1. The DRAM interface 226 may provide a row address XADD, the auto-refresh signal AREF, an activation signal ACT, and a precharge signal Pre. The auto-refresh signal AREF may be a periodic signal which may indicate when an auto-refresh operation is to occur. The activation signal ACT may be provided to activate a given bank of the memory. The row address XADD may be a signal including multiple bits (which may be transmitted in series or in parallel) and may correspond to a specific row of a memory bank (e.g., the memory bank activated by ACT/Pre).

The AGR row detector 230 may receive the current row address XADD. In some embodiments, the AGR row detector 230 may store the current value of the row address XADD, and/or determine if the current row address XADD is an aggressor address based on one or more previously stored row addresses. For example, in some embodiments, the AGR row detector 230 may determine if a row address is an aggressor address based on a number of times the row address XADD is received (e.g., the number of times the corresponding word line is accessed). In other embodiments, the AGR row detector 230 may determine that a row address with a highest access count value is an aggressor row address, regardless of the access count value. The AGR row detector 230 may further store victim data for victim word lines associated with the stored row addresses. For example, the AGR row detector 230 may store flags associated with each victim word line. The AGR row detector 230 may provide one or more of the addresses to the refresh address generator 232 as the matched address HitXADD. The match address HitXADD may represent an aggressor word line. In some embodiments, the AGR row detector 230 may further provide victim data, such as one or more flags FLAGS, as will be described in more detail, associated with the matched address HitXADD.

The row address XADD may change as the DRAM interface 226 directs access operations (e.g., read and write operations) to different rows of the memory cell array (e.g., memory cell array 118 of FIG. 1). In some embodiments, the AGR row detector 230 may store every received row address XADD. In other embodiments, the AGR row detector 230 may store received row addresses responsive to an active sample signal provided by a sample timing generator (not shown). In some embodiments, the sample signal may be a pulse signal. That is, it may transition to an active state and return to an inactive state after a time period (e.g., half a clock cycle, one clock cycle). The sample generator may regularly, randomly, or pseudo-randomly vary a time interval between pulses of the sample signal.

The RHR state control 236 may control the timing of targeted refresh operations. The RHR state control 236 may provide the row hammer refresh signal RHR to indicate that a targeted refresh (e.g., a refresh of the victim rows corresponding to an identified aggressor row) should occur. The RHR state control 236 may also provide an internal refresh signal IREF, to indicate that an auto-refresh should occur. Responsive to an activation of RHR, the refresh address generator 232 may provide a refresh address RXADD, which may be an auto-refresh address or may be one or more victim addresses corresponding to victim word lines of the aggressor word line corresponding to the match address HitXADD. The victim rows address may be based, at least in part, on the victim flags FLAGS provided by the AGR row detector 230. The row decoder circuit 208 may perform a targeted refresh operation responsive to the refresh address RXADD and the row hammer refresh signal RHR. The row decoder circuit 208 may perform an auto-refresh operation based on the refresh address RXADD and the internal refresh signal IREF. In some embodiments, the row decoder circuit 208 may receive the auto-refresh signal AREF provided by the DRAM interface 226, and the internal refresh signal IREF may not be used.

The RHR state control 236 may receive the auto-refresh signal AREF and provide the row hammer refresh signal RHR and the internal refresh signal IREF. The auto-refresh signal AREF may be periodically generated and may be used to control the timing of refresh operations. The memory device may carry out a sequence of auto-refresh operations in order to periodically refresh the rows of the memory device. The RHR signal may be generated in order to indicate that a particular targeted row address should be refreshed instead of an address from the sequence of auto-refresh addresses. For example, if an access count value associated with a row address XADD has reached or exceeded a threshold value. The RHR state control 236 may use internal logic to provide the RHR signal. In some embodiments, the RHR state control 236 may provide the RHR signal based on certain number of activations of AREF (e.g., every 4 activation of AREF). The RHR state control 236 may also provide an internal refresh signal IREF, which may indicate that an auto-refresh operation should take place. In some embodiments, the signals RHR and IREF may be generated such that they are not active at the same time (e.g., are not both at a high logic level at the same time).

Focusing now on the refresh address generator 232, the refresh address generator 232 may include an auto-refresh address generator 234 (AREF address generator), an address scrambler 238, a targeted address queue 240, a multiplexer 242, and a control logic circuit 244. In some embodiments, refresh address generator 232 may further include reverse scrambler 246. The refresh address generator 232 provides either an auto-refresh address Pre_RXADD or a victim address HitXADD2 based on match address HitXADD as the refresh address RXADD.

The AREF address generator 234 generates an auto-refresh address Pre_RXADD in response to the refresh signal AREF. The auto-refresh address Pre_RXADD may be part of a sequence of addresses to be refreshed as part of an auto-refresh operation. The AREF address generator 234 may update the current auto-refresh address Pre_RXADD to a next address in the sequence in response to an active refresh signal AREF. The AREF address generator 234 is also provided the command signal RHR from RHR state control 236. When the command signal RHR is active, the AREF address generator 234 may be controlled to stop updating the automatic refresh address Pre_RXADD even if the automatic refresh signal AREF is active in some embodiments. As described herein, since the active command signal RHR indicates that a targeted refresh operation is to be conducted instead of an automatic refresh operation, this allows the automatic refresh operation to be suspended while the targeted refresh is carried out, and resumed when the command signal RHR is not active. However, as will be described in more detail, an active Empty signal provided by the targeted address queue 240 may override the command signal RHR to prevent suspension of the automatic refresh operation in some embodiments.

The address scrambler 238 calculates one or more addresses to be refreshed based on aggressor row addresses identified by the AGR row detector 230 (e.g. row addresses XADD associated with count values above a threshold value) and the state of the victim data, such as victim flags FLAGS provided by the AGR row detector 230. The address scrambler 238 may be provided the match address HitX-ADD and the victim data as inputs. The address scrambler 238 may provide a targeted refresh address HitXADD1 in response to these inputs. The targeted refresh address HitX-ADD1 may be an address for a memory location (e.g., a word line) that may be affected by repeated activation of the memory location corresponding to the match address HitX-ADD. In other words, the match address HitXADD may be an 'aggressor' address, and the targeted refresh address HitXADD1 may be a 'victim' address. Different calculations may be used for generating different victim addresses as the targeted refresh address HitXADD.

The address scrambler 238 may employ different calculations to determine victim row addresses based on the state of the victim data, such as victim flags FLAGS. In one example, a first calculation may be used for the victim flags in the first state corresponding to victim word lines having a first physical relationship with the aggressor word line associated with the match address HitXADD (e.g., physically adjacent to the aggressor word line). A second calculation may be used for the victim flags in the first state corresponding to victim word lines having a second physical relationship with the aggressor word line associated with the match address HitXADD (e.g., physically adjacent to victim word lines physically adjacent to the aggressor word line). The calculations may provide targeted refresh addresses HitXADD1 corresponding to word lines which have a known physical relationship (e.g., a spatial relationship) with a word line corresponding to the match address HitX-ADD. The calculations may result in a single targeted refresh address HitXADD1 in some embodiments of the disclosure, for example, when only one victim flag is in the first (e.g., non-healed) state. The calculations may result in a sequence of targeted refresh addresses HitXADD1 in other embodiments of the disclosure, for example, when multiple victim flags are in the first state. In some embodiments, the address scrambler 238 may not calculate victim row addresses for victim word lines associated with victim data (e.g., victim flag) associated with a healed state (e.g., second logic level).

In one embodiment, the first calculation may cause the address scrambler 238 to output addresses which correspond to word lines that are adjacent to the word line corresponding to the match address HitXADD (e.g., HitXADD1=HitXADD+/−1). The second calculation may cause the address scrambler 238 to output addresses which correspond to word lines that are adjacent to word lines corresponding to the addresses HitXADD+/−1 (e.g., HitX-ADD1+/−2). Other calculations are possible in other example embodiments. For example, the first calculation may be based on a physical relationship with the match address HitXADD1, while the second calculation may be based on a physical relationship with the address(es) provided by the first calculation. The targeted addresses HitX-ADD1 calculated by the address scrambler 238 may be provided to a targeted address queue 240 in some embodiments.

The targeted address queue 240 may receive targeted refresh address HitXADD1 from address scrambler 238 and provide the targeted refresh address HitXADD2 based on the targeted refresh address HitXADD1. Targeted address queue 240 may store one or more targeted refresh addresses HitXADD1 received from the address scrambler 238. In some embodiments, the targeted address queue 240 may compare the victim row addresses HitXADD1 to the current victim row addresses stored in the queue. If the victim row address HitXADD1 is already in the queue, the victim row address HitXADD1 is not added. Access count values for multiple row addresses may meet or exceed the threshold value between targeted refresh time slots. Furthermore, each row address may be associated with multiple victim row addresses. In some embodiments, the victim row addresses (e.g., HitXADD1) may be stored in the targeted address queue 240 for refreshing during sequential targeted refresh time slots. The targeted address queue 240 may be a "first-in-first-out" queue in some embodiments. In some embodiments, the targeted address queue 240 may include a plurality of registers. However, other storage structures may be used. In some embodiments, the targeted address queue 240 may have a pointer that points to a victim row address to be output as targeted refresh address HitXADD2. Responsive to an active command signal RHR, the pointer may be incremented to the next victim row address in the queue and the next victim row address may be output as HitXADD2. In some embodiments, the targeted address queue 240 may clear a register once the victim row address stored in the register is provided as HitXADD2. In some embodiments, the targeted address queue 240 may use a flag to indicate a victim row address has been provided as HitXADD2. Clearing the register and/or setting flags may allow the targeted address queue 240 to determine when a register is available for rewriting and/or the queue is empty. Other techniques for controlling the queue and determining the status of the queue may also be used. If the targeted address queue 240 determines the queue of victim row addresses is empty, the targeted address queue 240 may activate an Empty signal.

The multiplexer 242 accepts the automatic refresh address Pre_RXADD provided by the AREF address generator 234 and the targeted refresh address HitXADD2 provided by the targeted address queue 240 and outputs one of them as the refresh address RXADD. The multiplexer 242 may select between the two refresh addresses based on the command signal RHR and Empty signal. Control logic circuit 244 is provided the command signals RHR and Empty and an output is provided to the multiplexer 242 to control selection of providing the Pre_RXADD or HitXADD2 addresses as the refresh address RXADD. The control logic circuit 244 outputs a first logic level if command signal RHR is active and Empty is inactive. The multiplexer 242 outputs the targeted address HitXADD2 in response to the first logic level. If command signal RHR is inactive, the control logic circuit 244 may output a second logic level regardless of the Empty signal. The multiplexer 242 outputs the automatic refresh address Pre_RXADD in response to the second logic level. If the command signal RHR is active, but the Empty signal is active (e.g., the targeted address queue 240 is empty), the control logic circuit 244 may output the second logic level and the multiplexer 242 may output the automatic refresh address Pre_RXADD. As mentioned previously, the active Empty command may override the command signal RHR provided to the AREF address generator 234, so a current Pre_RXADD is provided. Thus, even during a targeted refresh interval, if no victim rows require refreshing, an automatic refresh operation may be performed. However, in other embodiments, if no victim row address is available, the refresh address generator 232 may not provide a refresh address RXADD, and no refresh operation may be performed during a targeted refresh time slot.

A refreshed word line (e.g., a word line corresponding to refresh address RXADD) may be a potential victim of multiple aggressor word lines. For example, two potential aggressor word lines may be directly adjacent on opposite sides of the refreshed word line. If the row addresses corresponding to both aggressor word lines are stored in the AGR row detector 230, there may be victim data corresponding to the refreshed word line associated with both row addresses. For example, a given word line may be associated with the R+1 victim flag of one row address and the R−1 victim flag of another row address. Thus, if the refreshed word line is refreshed based on the victim data associated with one row address and also refreshed again based on the victim data associated with the other row address then the word line may be refreshed more often than necessary. In some applications, this may cause the steal rate to be set higher than necessary.

Furthermore, similar to a refreshed word line, an accessed word line may be a victim of one or more word lines corresponding to row addresses stored in the AGR row detector 230. When a word line is accessed during a memory access operation (e.g., activation, read, write), the data in the word line is also refreshed. Accordingly, in some instances, if a word line corresponding to a row address XADD is accessed and then subsequently refreshed based on the victim data associated with row addresses stored in the AGR row detector 230 then the accessed word line is refreshed despite the access operation rendering moot the need for a refresh operation. In some applications, this may cause the steal rate to be set higher than necessary.

In some embodiments, the refresh address generator 232 may include a reverse scrambler 246 to determine potential aggressor row addresses (e.g., aggressor row addresses) associated with the refresh address RXADD or accessed row address XADD. That is, the refresh address generator 232 may determine aggressor word lines physically adjacent to the word line (e.g., RXADD+1 and RXADD−1 or XADD+1 and XADD−1) and/or word lines which are physically adjacent to the physically adjacent word lines of the word line (e.g., RXADD+2 and RXADD−2 or XADD+2 and XADD−2). The calculated aggressor row addresses AXADD may be provided to the AGR row detector 230 and compared to the row addresses XADD stored in the AGR row detector 230. If an aggressor row address AXADD matches, the appropriate victim data (e.g., the victim flag) associated with the matching row address XADD may be set to a state indicating the victim word line has been healed (and/or that a refresh is no longer necessary). This may reduce unnecessary refreshes of victim word lines that are victims of one or more word lines corresponding to row addresses stored in the AGR row detector 230.

Different calculations may be used for generating different aggressor row addresses AXADD. The calculations may result in an aggressor address AXADD in some embodiments of the disclosure. The calculations may result in a sequence of aggressor row addresses AXADD in other embodiments of the disclosure. In other words, the reverse scrambler 246 may determine row addresses for all of the word lines that could cause the word line corresponding to RXADD or XADD to become a victim word line.

In some embodiments, the reverse scrambler 246 and address scrambler 238 may have the same or similar circuitry. For example, both the reverse scrambler 246 and address scrambler 238 calculate row addresses based on physical relationships between word lines. However, the input addresses provided to the address scrambler 238 and reverse scrambler 246 are different as described above. In some embodiments, not shown in FIG. 2, a single address scrambler may be used. Additional control logic may be used to switch between the inputs (e.g., HitXADD, RXADD, XADD) and outputs (e.g., AGR row detector, targeted address queue).

In some embodiments, the reverse scrambler 246 may only receive the refresh address RXADD or the accessed row address XADD for calculating aggressor row addresses AXADD. While these embodiments may provide less feedback for adjusting the victim data in the AGR row detector 230, calculating aggressor row addresses AXADD for only the refresh address RXADD or accessed row address XADD may reduce a number of computations and/or comparisons, which may in turn reduce power consumption and/or computing time.

In some embodiments, other victim data in the refresh control circuit 216 may be adjusted in addition to—or instead of—the victim data stored in the AGR row detector 230. For example, victim data may include victim row addresses. In some embodiments, victim row addresses stored in the targeted address queue 240 may be adjusted. In some embodiments, the targeted address queue 240 may receive the auto-refresh address Pre_RXADD and/or the accessed row address XADD. The targeted address queue 240 may compare the auto-refresh address Pre_RXADD and/or row address XADD to the victim row addresses stored in the queue. If a match is found, the victim row address may be removed from the queue as the victim word line associated with the victim row address was already healed by an access or auto-refresh operation. Thus, by removing the victim row address, the victim data is adjusted to indicate the victim word line associated with the victim row address has been healed.

In some applications, adjusting the victim row addresses stored in the targeted address queue 240 may be advantageous because no "reverse" calculation of aggressor row addresses is required. However, in some applications, adjusting victim data in the AGR row detector 230 may be advantageous because it may reduce unnecessary victim row address calculations performed by the address scrambler 238. In some applications, it may be advantageous to adjust victim data in the targeted address queue 240 and victim data in the AGR row detector to reduce unnecessary targeted refresh operations.

The row decoder circuit 208 may perform one or more operations on the memory array (not shown) based on the received signals and addresses. For example, responsive to the activation signal ACT and the row address XADD (and IREF and RHR being at a low logic level), the row decoder circuit 208 may direct one or more access operations (for example, a read operation) on the specified row address XADD. Responsive to the RHR signal being active, the row decoder circuit 208 may refresh the refresh address RXADD.

Figure 3:
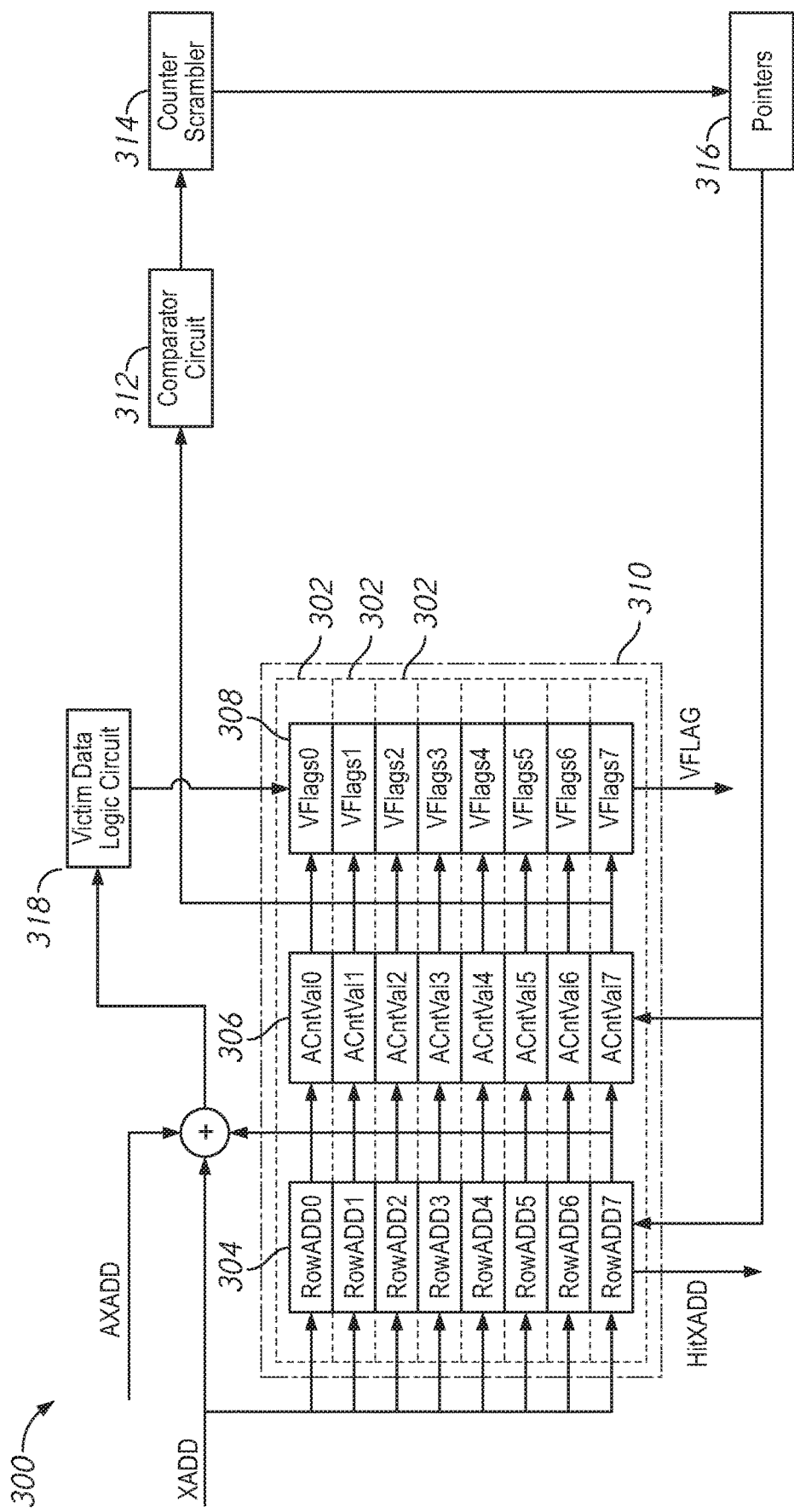
FIG. 3 is a block diagram of an aggressor row detector circuit according to an embodiment of the present disclosure.

FIG. 3 is a block diagram of an aggressor row detector (e.g., AGR row detector) 300 according to an embodiment of the present disclosure. In some embodiments, the AGR row detector 300 may be included in AGR row detector 230 of FIG. 2. The AGR row detector 300 may include stack 310. Stack 310 may be a content addressable memory (CAM)

address stack in some embodiments, however other types of data storage may be used in other embodiments. The stack 310 may include multiple registers 302, each of which may have corresponding fields 304, 306, and 308. Each field 304, 306, and 308 may include one or more bits. The number of bits in each field may be based, at least in part, on a type of data to be stored in the field. While the example in FIG. 3 shows eight registers 302 in the stack 310, it is understood that the stack could include fewer or more registers. For example, the stack 310 could have one hundred registers. In another example, the stack 310 could have four hundred registers. In the embodiment shown in FIG. 3, each register 302 includes a field 304 configured to store a row address (RowADD0-7), and a field 306 configured to store an access count value (ACntVal0-7), a field 308 configured to store victim data, such as one or more victim flags (Vflags0-7) in the example shown in FIG. 3. In other embodiments, more or fewer fields may be used. For example, multiple fields may be used to store different portions of the row addresses.

The fields 304 may receive a row address XADD. In some embodiments, the fields 304 may receive row address XADD from an address decoder circuit, such as address decoder circuit 104 shown in FIG. 1. The fields 304 storing row addresses may be coupled to a refresh address generator (not shown in FIG. 3), such as refresh address generator 234 shown in FIG. 2, and provide a matched address HitXADD to the address generator. The field 308 for storing victim flags may have a flag (e.g., bit) for each victim word line which is a potential victim of the word line corresponding to the row address stored in field 304. For example, field 308 may have four flags corresponding to R+1, R−1, R+2, and R−2 victim word lines. In other examples, field 308 may have two flags corresponding to R+1 and R−1. Other numbers of bits may be used, for example, each flag may include two bits where a first bit indicates a healed state (e.g., healed or unhealed) and a second bit indicates a proximity of the associated word line (e.g., R+/1 or R+/−2). In some embodiments, the field 308 for storing victim flags may also be coupled to the refresh address generator and provide the victim flags VFLAG to the refresh address generator. The fields 306 storing the access count values may be coupled to a comparator circuit 312 which may be coupled to pointers 316 through a counter scrambler 314.

In some embodiments, each time a row address XADD is provided, the current row address XADD may be compared to the fields 304. In other embodiments, as mentioned previously, rather than storing each row address XADD received, the stack 310 may store the row address XADD responsive to a sampling signal (not shown). In these embodiments, only row addresses XADD received while the sampling signal is active are compared to the fields 304. If the current row address XADD is already stored in one of the registers 302, then the access count value in field 306 may be adjusted (e.g., increased). If the current row address XADD is not already stored in one of the registers 302, it may be added to the register 302 in field 304. If there is an open register (e.g., a register without a row address) then the row address XADD may be stored in the open register. If there is not an open register, then the register 302 associated with the lowest count value (as indicated by the pointers 316) may have its row address replaced with the current row address XADD. When a new row address is written to a register 302, the victim flags may be set to a first state indicating that none of the associated victim word lines have been refreshed and the counter may be reset to an initial value (e.g., 0) in some embodiments.

A victim word line may be a victim based on multiple aggressor word lines, thus, when a victim word line is refreshed, it may be associated with multiple victim flags in the register 302. Calculating the aggressor row addresses and comparing them to the row addresses stored in the register 302 may reduce redundant victim row refreshes in some applications. In some embodiments, the stack 310 may receive aggressor row addresses AXADD. The aggressor row addresses AXADD may be based, at least in part, on a refresh address RXADD or a received row address XADD. In some embodiments, the aggressor row address AXADD may correspond to word lines that may victimize a word line corresponding to RXADD or XADD. The aggressor row addresses AXADD may be compared to the fields 304. If the aggressor row addresses AXADD do not match any of the stored row addresses, no action is taken by the stack 310. If the aggressor row addresses AXADD match one or more row addresses, the appropriate victim flag or flags stored in field 308 may be set to a state indicating that the victim word line has been healed by victim data logic circuit 318 as will be described in more detail with reference to FIG. 5.

In some embodiments, the comparator circuit 312 may compare the access count values in fields 306 to a threshold value to determine if an access count value for a row address has matched or exceeded the threshold value (e.g., 1,000, 2,000, 3,000). In some embodiments, the comparator circuit 312 may further compare the access count values to determine which row address is associated with the lowest access count value. The fields 306 corresponding to the minimum count value and count values that meet or exceed the threshold value may be provided to a counter scrambler 314, which may match the above threshold value fields and minimum count value field to their respective associated row address fields 304. The pointers 316 may point to the row addresses in fields 304 associated with count values at or above the threshold value and may point to the field 304 associated with the minimum count value in fields 306. The threshold value pointer(s) may be used to provide the corresponding row address(es) as HitXADD and the corresponding victim flags as VFLAG to the refresh address generator. When a target refresh operation is carried out based on the address HitXADD, some or all of the victim flags may be set to a second state indicating the corresponding victim word lines have been refreshed. If all of the victim flags are set to the second state (e.g., all victim word lines have been refreshed), the access count value may be reset. The minimum count value pointer may be used to overwrite a register 302 when a new row address XADD is received and there is no open register 302 to store it in.

In other embodiments, the comparator circuit 312 may compare the count values to determine which row address is associated with the highest access count value. The field 306 corresponding to the highest count value may be provided to the count scrambler 314, which may match the highest count value field to its associated row address field 304. The highest count value pointer 316 may be used to provide the corresponding row address as HitXADD, and the corresponding victim flags as VFLAG to the refresh address generator.

Figure 4:
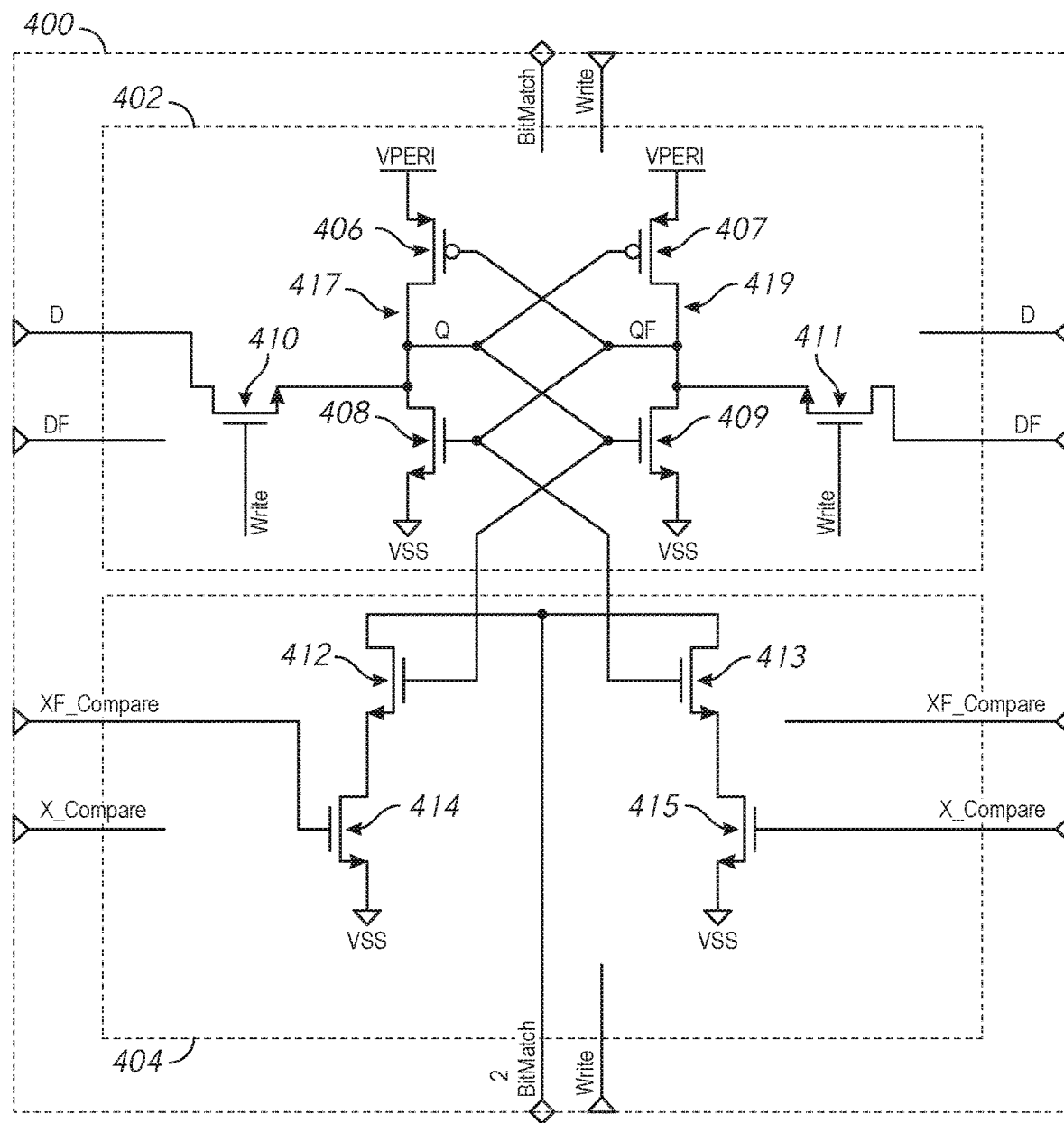
FIG. 4 is a schematic diagram of a content addressable memory cell according to an embodiment of the disclosure.

FIG. 4 is a diagram of a content addressable memory (CAM) cell according to an embodiment of the present disclosure. In some embodiments, the CAM cell 400 may be included in a stack, such as stack 310 shown in FIG. 3. In some embodiments, the CAM cell 400 may be included in a register, such as registers 302 shown in FIG. 3. In some embodiments, the CAM cell 400 may be included in targeted address queue 240 in FIG. 2. For example, the targeted address queue 240 may include a stack, which may include one or more registers, for storing victim row addresses. A register may include multiple CAM cells 400. A register may include a CAM cell for every bit stored in the register. For example, a register may include a CAM cell for each bit of a row address, each bit of an access count value, and each flag bit. A stack may include multiple registers that include CAM cells.

The CAM cell 400 includes a latch portion 402 and a comparator portion 404. The CAM cell 400 may generally use voltages to represent the values of various bits. The CAM cell 400 may include conductive elements (e.g., nodes, conductive lines) which carry a voltage representing a logical value of that bit. For example, a high logical level may be represented by a first voltage (e.g., a system voltage such as VPERI), while a low logical level may be represented by a second voltage (e.g., a ground voltage, such as VSS).

The latch portion 402 includes a first transistor 406 which has a source coupled to a node which provides a voltage VPERI, which may represent a high logical level. The first transistor 406 has a drain coupled to a node 417 having a voltage which represents the value of the signal Q and a gate coupled to a node 419 having a voltage which represents a value of the complementary signal QF. The signal Q represents the logical level of a bit stored in the latch portion 402. The first transistor 406 may be a p-type transistor. The latch portion 402 also includes a second transistor 407 which has a source coupled to the node which provides VPERI, a gate coupled to the node 417 and a drain coupled to the node 419. The second transistor 407 may be a p-type transistor.

The latch portion 402 includes a third transistor 408 which has a drain coupled to the node 417, a gate coupled to the node 419, and a source coupled to a node providing a ground voltage VSS, which may represent a low logical level. The third transistor 408 may be an n-type transistor. The latch portion 402 includes a fourth transistor 409 which has a drain coupled to the node 419, a gate coupled to the node 417, and a source coupled to the node providing the ground voltage VSS. The fourth transistor 409 may be an n-type transistor. The transistors 406 and 408 may form an inverter circuit and the transistors 407 and 409 may form another inverter circuit, and the two inverter circuits are cross-coupled to one another.

In operation, the first, second, third, and fourth transistors 406-409 may work to store the value of the stored signals Q and QF. The transistors 406-409 may work together to couple the node 417 carrying Q and the node 619 carrying QF to a node providing the system voltage (e.g., VPERI or VSS) associated with the value of the signals Q and QF. For example, if the stored signal Q is at a high logical level, then the inverse signal QF is at a low logical level. The first transistor 406 may be active, and VPERI may be coupled to the node 417. The second transistor 407 and the third transistor 408 maybe inactive. The fourth transistor 409 may be active and may couple VSS to the node 419. This may keep the node 417 at a voltage of VPERI, which represents a high logical level, and the node 419 at a voltage of VSS, which represents a low logical level. In another example, if the stored signal Q is at a low logical level, then the inverse signal QF may be at a high logical level. The first transistor 406 and the fourth transistor 409 may both be inactive. The second transistor 407 may be active and may couple VPERI to the node 419. The third transistor 408 may also be active and may couple VSS to the node 417. In this manner, the stored signal Q and QF may be coupled to a respective system voltage corresponding to their current logical levels, which may maintain the current logical value of the stored bit.

The latch portion 402 also includes a fifth transistor 410 and a sixth transistor 411. The transistors 410 and 411 may act as switches which may couple a signal line which carries input data D and a signal line carrying inverse input data DF to the nodes 417 and 419 carrying Q and QF respectively when a write signal Write is active. The fifth transistor 410 has a gate coupled to a line carrying the Write signal, a drain coupled to the signal D, and a source coupled to the node 419. The sixth transistor 411 has a gate coupled to the Write signal, a drain coupled to the signal DF, and a source coupled to the node 419. Accordingly, when the Write signal is at a high level (e.g., at a voltage such as VPERI), the transistors 410 and 411 may be active, and the voltages of the signals D and DF may be coupled to the nodes 417 and 419 carrying Q and QF respectively.

In some embodiments, the first through sixth transistors 406-411 may generally all be the same size as each other.

The CAM cell 400 also includes a comparator portion 404. The comparator portion 404 may compare the signals Q and QF to the signals X_Compare and XF_Compare. The signal X_Compare may represent a logical level of an external bit provided to the comparator portion 404. If there is not a match between the signals Q and X_Compare (and therefore between QF and XF_Compare), then the comparator portion 404 may change a state of from the BitMatch signal from a first logical level (e.g., a high logical level) to a second logical level (e.g., a low logical level). For example, if the stored and external bits do not match, the comparator portion 404 may couple the ground voltage VSS to a signal line carrying the signal BitMatch. In some embodiments, if there is a match between the stored and external bits, then the comparator portion 404 may do nothing. In some embodiments, the signal BitMatch may be precharged to a voltage associated with a high logical level (e.g., VPERI) before a comparison operation.

The comparator portion includes a seventh transistor 412, an eighth transistors 413, a ninth transistor 414, and a tenth transistor 415. The seventh transistor 412 includes a drain coupled to the signal BitMatch, a gate coupled to the node 417 (e.g., the signal Q), and a source coupled to a drain of the ninth transistor 414. The ninth transistor 414 also has a gate coupled to the signal XF_Compare and a source coupled to a signal line providing the ground voltage VSS.

The eighth transistor 413 has a drain coupled to the signal BitMatch, a gate coupled to the node 419 (e.g., the signal QF), and a source coupled to a drain of the tenth transistor 415. The tenth transistor has a gate coupled to the signal X_Compare and a source coupled to the ground voltage VSS.

Since the signal Q is complementary to the signal QF, the comparator portion 402 may operate by comparing the external signal X_Compare to the signal QF to see if they match, and the inverse external signal XF_Compare to the stored signal Q to see if they match. If they do match, it may indicate that the signal X_Compare does not match the signal Q and that the signal XF_Compare does not match the signal QF, and thus that the external bits do not match the associated stored bits.

The comparator portion 404 may use relatively few components, since it changes the signal BitMatch from a known state (e.g., a precharged high logical level) to a low logical level. Thus, it may not be necessary to include additional components (e.g., additional transistors) to change the logical level of the signal BitMatch from low to high, or from an unknown level to either low or high. The comparator portion 404 may take advantage of this to provide dynamic logic. For example, the comparator portion 404 has two portions (e.g., transistors 412/414 and transistors 414/415) either of which may couple the signal BitLine to the voltage VSS if there is not a match between the stored and external bit. Since only one of the portions is active at a time, only the state of the signal Q or QF needs to be checked by the active portion. Either of the portions is equally capable of changing the signal BitMatch to a low logical level.

In an example operation, if the stored signal Q is at a high logical level (and thus the signal QF is low) and the external signal X_Compare is also high (and the signal XF_Compare is low), then the external signals may match the stored signals, and the transistors 412 and 415 may be active while the transistors 414 and 413 are inactive. This may prevent the ground voltage VSS from being coupled to the signal BitMatch. If the signal X_Compare is low (e.g., if there is not a match), then the external signals may not match the stored signals, and the transistors 412 and 414 may be active while transistors 413 and 415 are inactive. The transistors 412 and 414 being active at the same time may couple the ground voltage VSS to the signal BitMatch.

In another example operation if the stored signal Q is low (and thus the signal QF is high) then the transistor 412 may be inactive while the transistor 413 is active. If the external signal X_Compare is low (and XF_Compare is high) then the external signal may match the stored bits, and the transistor 414 is active while transistor 415 is inactive. If the signal X_Compare is high (and the signal XF_Compare is low) then the external signal may not match the stored signal and the transistor 414 may be inactive while the transistor 415 is active. Accordingly, the signal BitMatch may be coupled to ground voltage VSS through active transistors 413 and 415.

In some embodiments, the transistors 412-415 of the comparator portion 404 may generally all have the same size to each other. In some embodiments, the transistors 412-415 of the comparator portion 404 may be a different size than the transistors 406-411 of the latch portions 402.

As discussed previously, a word line may be a victim of multiple aggressor word lines. For example, a victim word line may be a victim due to a row hammer on an adjacent aggressor word line on either side of the victim word line. Thus, the victim word line may potentially be the victim to two different aggressor word lines. In another example, the victim word line may also be a victim due to a row hammer on aggressor word lines adjacent to the word lines adjacent to the victim word line on either side. Thus, the victim word line may be a potential victim of four different aggressor word lines. However, even though the victim word line may be a victim due to concurrent or near concurrent (e.g., at or near the same time) row hammers on multiple word lines, the victim word line may only need to be 'healed' (e.g., refreshed) once to preserve data in the victim word line. Furthermore, if the victim word line is accessed during a memory operation, such as during a read or write operation, the accessing may heal the victim word line.

As described with reference to FIG. 3, accessed row addresses are stored in a stack along with victim flags corresponding to victim word lines of the accessed word lines. Since a victim word line may be a victim of multiple accessed word lines, the stack may include multiple victim flags that correspond to the same victim word line. For example, row addresses for accessed word lines physically adjacent on either side of a victim word line will both have victim flags corresponding to the victim word line stored in the stack. When one of the row addresses is determined to be an aggressor row, the victim word line may be refreshed and its victim flag associated with that row address may be reset. However, if the other of the row addresses is also determined to be an aggressor row, the victim word line may again be refreshed and its victim flag associated with the other row address may be reset. In some cases, the second refresh of the victim row may not be necessary because it was recently refreshed due to the first victim row.

Victim data stored in a stack, such as stack 310 in FIG. 3, may only reflect data for victim word lines affected by targeted refresh operations. If a victim word line is accessed during a memory access operation or an auto-refresh operation, no victim flags in the stack may be reset because the access of the victim word line was not associated with a matched address HitXADD from the stack. Accordingly, an accessed victim word line may be refreshed after being accessed due to the victim word line's association with one or more row addresses stored in the stack via victim flags. Similar to above, these subsequent refreshes of the victim word line after the victim word line has been accessed may be unnecessary to preserve data in the victim row.

Figure 5:
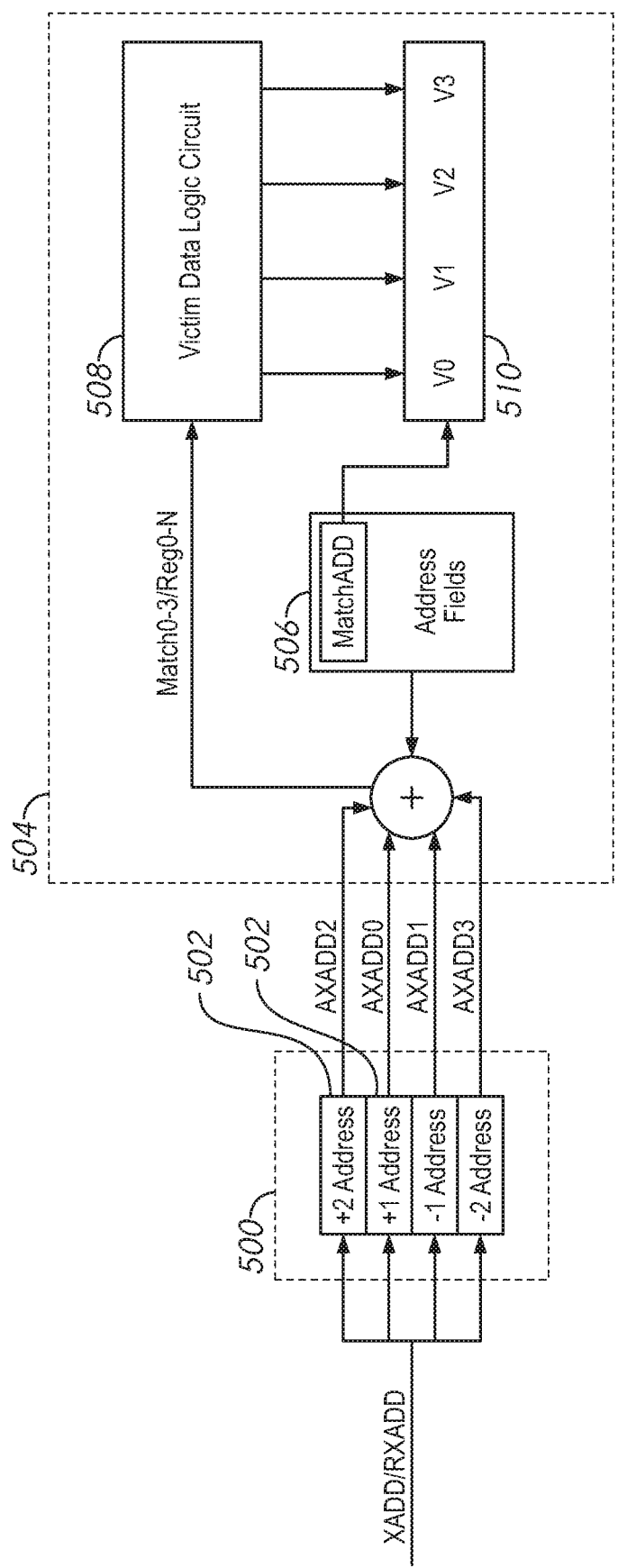
FIG. 5 is a block diagram of a reverse scrambler and a portion of an aggressor row detector circuit according to an embodiment of the present disclosure.

FIG. 5 is a block diagram of a reverse scrambler 500 and a portion of an aggressor row detector 504 in accordance with an embodiment of the present disclosure. The reverse scrambler 500 may be included in reverse scrambler 246 shown in FIG. 2 in some embodiments. The portion of the aggressor row detector 504 may be included in aggressor row detector 300 in FIG. 3 and/or aggressor row detector 230 shown in FIG. 2. In some embodiments, the reverse scrambler 500 may reduce unnecessary refreshes of victim word lines by adjusting the data associated with the victim word line (e.g., victim flags) based on refreshing and/or accessing of the victim word line.

The reverse scrambler 500 may receive a row address XADD and/or a refresh address RXADD. In some embodiments, the row address XADD may be received from an address decoder circuit, such as address decoder circuit 104 shown in FIG. 1. In some embodiments, the refresh address may be received from a refresh address generator, such as refresh address generator 232 shown in FIG. 2. In some embodiments, the reverse scrambler 500 may have one or more aggressor row address generators 502. In some embodiments, the number of aggressor row address generators 502 may be based on a number of aggressor word lines to be determined for a victim word line associated with the row address XADD and/or refresh address RXADD. In some embodiments, not shown in FIG. 5, the reverse scrambler 500 may include two sets of aggressor row address generators 502. One set may receive the refresh address RXADD and the other set may receive the row address XADD.

Each aggressor row address generator 502 may determine a row address (AXADD0-3) of one aggressor word line having a different physical relationship to a victim word line associated with the refresh address RXADD and/or row address XADD. In the example shown in FIG. 5, the reverse scrambler 500 includes four aggressor row address generators 502 to calculate the row address for the R+/−1 and R+/−2 aggressor word lines of the victim word line. In other examples, more or fewer aggressor row address generators 502 may be included. In some embodiments, the number of aggressor rows addresses generated may be based on the number of victim rows generated by an address scrambler, such as address scrambler 238 show in FIG. 2. For example, if the address scrambler calculates victim row addresses R+/−1 and R+/−2, then the aggressor row address generator 502 may calculate aggressor row addresses R+/−1 and R+/−2.

The aggressor row address generators 502 may determine the aggressor row address in a variety of ways. For example, in some embodiments, the aggressor row generators 502 may refer to a look-up table to determine the aggressor row addresses associated with the row address XADD and/or refresh address RXADD. In another example, in some embodiments, the aggressor row generators 502 may include logic gates or other circuit components for carrying out a conversion between the victim row address and the aggressor row addresses. The conversion may be based on a relationship between physical word line locations and row addresses in a design of the memory. Each aggressor row address generator 502 may output an aggressor row address AXADD0-3. In some embodiments, the aggressor row addresses may be provided on separate output lines as shown in FIG. 5. In other embodiments, the aggressor row addresses may be provided in series on a single output line. Although shown as four separate modules in FIG. 5, in some embodiments, the aggressor row address generators 502 may be a single component capable of calculating all four aggressor row addresses and providing the aggressor row addresses on separate output lines or a single output line.

All of the aggressor row addresses AXADD0-3 calculated by the reverse scrambler 500 may be provided to the aggressor row detector circuit 504. Specifically, the aggressor row addresses AXADD0-3 may be compared to row addresses stored in the address fields 506 of a stack. In some embodiments, each aggressor row address AXADD0-3 may be compared to the row addresses stored in the address fields 506 sequentially (e.g., in series). In other embodiments, all of the aggressor row addresses may be compared to the row addresses stored in the address fields 506 at the same time (e.g., in parallel). If no matches are found between the aggressor row addresses AXADD0-3 and the stored row addresses in the address fields 506, no further action is taken by the aggressor row detector 504. If a match between one or more of the aggressor row addresses AXADD0-3 and one or more row addresses in the address fields 506, shown as MatchADD in FIG. 5, match signals Match-3 is activated and provided to victim data logic circuit 508. For simplicity, in the example shown in FIG. 5, only one match address MatchADD is shown. However, as mentioned, multiple aggressor rows may have matches in the address fields 506.

Although shown as a single line in FIG. 5, the match signals Match0-3 may be transmitted on separate lines. For example, a separate line for match signals Match0, Match1, Match2, and Match3. Each match signal may correspond to a particular aggressor row address. For example, Match0 may correspond to AXADD0, Match1 may correspond to AXADD1, etc. When an aggressor row address AXADD0-3 matches with row address MatchADD, the corresponding match signal may be activated. For example, if AXADD2 matched MatchADD, Match2 may be activated. In some embodiments, a signal Reg0-N may provide an indication of which register in the stack includes the matched address MatchADD, may be provided to the victim data logic circuit 508. In some embodiments, the signal Reg0-N may be provided on a separate line from the match signals Match0-3. In other embodiments, the indication may be provided on the same line as the corresponding match signal in series with the active signal.

Responsive to the active match signal and register indication, the victim data logic circuit 508 may adjust the victim data to indicate the corresponding victim word line has been healed. For example, the victim data logic circuit 508 may set the appropriate victim flag V0-3 stored in a victim flag field 510 associated with the row address MatchADD to a healed state (e.g., reset, set to the second state). Continuing with the example above, when the victim data logic circuit 508 receives the active Match2 signal, the victim data logic circuit 508 may set the victim flag V2 stored in victim flag field 510 to a healed state. For example, if victim flag V2 was a '1' indicating the word line associated with the victim flag had not been healed, the victim data logic circuit 508 may change victim flag V2 to a '0' indicating the word line associated with the victim flag had been healed. Thus, in some embodiments, when a word line corresponding to RXADD or XADD is refreshed or accessed, all of the victim flags associated with the word line in the aggressor row detector 504 may be adjusted to indicate the data in the word line has been healed. This may reduce unnecessary refreshes of the word line corresponding to RXADD and XADD in some embodiments.

While the examples described in FIGS. 2, 3, and 5 refer to victim data stored as victim flags including one or more bits, other forms of victim data may be used. For example, different numerical values may be used to indicate the healed or unhealed state of the victim word lines associated with each stored row address.

Figure 6:
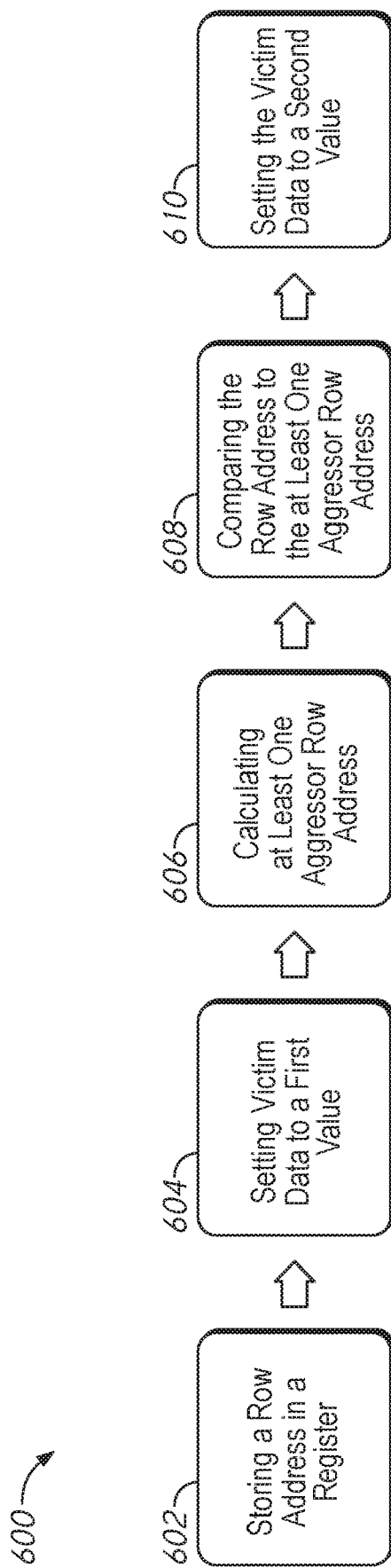
FIG. 6 is a flow chart of a method according to an embodiment of the present disclosure.

FIG. 6 is a flow chart 600 of a method according to an embodiment of the disclosure. At block 602, a step of "storing a row address in a register," may be performed. The row address may be an address received with a memory access operation in some embodiments. The register may be included in a refresh control circuit, such as refresh control circuit 116 in FIG. 1 and/or refresh control circuit 216 shown in FIG. 2. At block 604, a step of "setting victim data to a first value" may be performed. In some embodiments, the victim data may be associated with the row address in the register. In some embodiments, the victim data may be associated with victim word lines of a word line corresponding to the row address.

At block 606, a step of "calculating at least one aggressor row address" may be performed. In some embodiments, the aggressor row address may be based on a refresh address or an accessed row address. In some embodiments, the refresh address may be provided by a refresh address generator, such as refresh address generator 232 of FIG. 2. At block 608, a step of "comparing the row address to the at least one aggressor row address" may be performed. In some embodiments, the comparing may be performed by an aggressor row detector circuit, such as aggressor row detector circuit 230 shown in FIG. 2, aggressor row detector circuit 300 shown in FIG. 3, and/or the portion of aggressor row detector circuit 504 shown in FIG. 5. At block 610, a step of "setting the victim data to a second value" may be performed if the row address matches the at least one aggressor row address. In some embodiments, the setting may be performed by a victim data logic circuit, such as victim data logic circuit 318 shown in FIG. 3 and/or victim data logic circuit 508 shown in FIG. 5. In some embodiments, the victim data comprises a plurality of bits. Each bit may correspond to a victim word line of a word line associated with the row address in these embodiments. If the row address does not match the aggressor address, in some embodiments, no action may be performed.

In some embodiments, the method shown in flow chart 600 may further include storing a count value associated with the row address in the register. In some embodiments, the register may be included in a stack, such as stack 310 shown in FIG. 3. In some embodiments, the method may include adjusting the count value each time the accessed row address is received. When the count value reaches a threshold value, in some embodiments, the method may further include calculating at least one victim row address when the victim data is set to the first value. In some embodiments, the method may further include refreshing the at least one victim row address during a targeted refresh operation. In some embodiments, the method may further include setting the victim data to the second value and/or resetting the count value.

In some embodiments, a method may include comparing an auto-refresh address or an accessed row address to one or more victim row addresses stored in a queue. If the auto-refresh address or accessed row address does not match the one or more victim row addresses, no action is taken. If the auto-refresh address or accessed row address matches the one or more victim row addresses, the matching one or more victim row addresses is removed from the queue.

The apparatuses and methods described herein may allow for adjusting the victim word line data associated with accessed row addresses. For example, the victim word line data may be adjusted to indicate that victim word lines have already been healed. Adjusting the victim word line data as described herein may reduce the number of unnecessary refresh operations in some applications.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
a stack configured to store:
a plurality of row addresses corresponding to a plurality of word lines; and
victim data associated with each of the plurality of row addresses, wherein the victim data corresponds to at least one victim word line of each of the plurality of accessed word lines associated with the plurality of row addresses, wherein the victim data indicates whether the at least one victim word line has been healed;
a reverse scrambler configured to provide an aggressor row address associated with at least one of a refresh address or an accessed row address; and
a victim data logic circuit configured to adjust the victim data associated with a row address of the plurality of row addresses that matches the aggressor row address.

2. The apparatus of claim 1, further comprising a refresh address generator configured to provide the refresh address corresponding to a word line to be refreshed, wherein the refresh address is based on at least one of a victim row address corresponding to the at least one victim word line or an auto-refresh address.

3. The apparatus of claim 2, further comprising an address scrambler configured to provide the victim row address, wherein the victim row address is based, at least in part, on the row address of the accessed word line associated with the at least one victim word line.

4. The apparatus of claim 3, wherein the victim row address is further based, at least in part, on the victim data.

5. The apparatus of claim 1, wherein the victim data logic circuit adjusts the victim data to indicate the at least one victim word line has been healed.

6. The apparatus of claim 1, wherein the victim data comprises a plurality of bits, wherein each bit of the plurality of bits corresponds to a victim word line associated with the accessed word line of a corresponding row address of the plurality of row addresses, wherein a bit in a first state indicates the victim word line has not been healed and the bit in a second state indicates the victim word line has been healed.

7. The apparatus of claim 6, wherein the victim data logic circuit adjusts the bit in the first state to the second state when the corresponding row address matches the aggressor address.

8. An apparatus comprising:
a reverse scrambler configured to provide an aggressor row address associated with at least one of a refresh address or an accessed row address;
a victim data logic circuit configured to set a victim flag to a refreshed state, wherein the victim flag is associated with a row address that matches the aggressor row address; and
an address scrambler configured to provide at least one victim address based on the row address when the victim flag is in an unhealed state, wherein the at least one victim address is used to refresh a victim word line during a targeted refresh operation.

9. The apparatus of claim 8, further comprising an aggressor row detector including the victim data logic circuit, wherein the aggressor row detector is configured to compare the aggressor row address to the row address and provide a match signal to the victim data logic circuit, wherein the victim data logic circuit sets the victim flag responsive to the match signal in an active state.

10. The apparatus of claim 9, wherein the aggressor row detector includes a stack configured to store a plurality of row addresses and a corresponding plurality of victim flags in a plurality of registers.

11. The apparatus of claim 10, wherein the stack includes a content addressable memory.

12. The apparatus of claim 10, wherein the aggressor row detector further provides a signal that indicates which register of the plurality of registers includes the row address that matches the aggressor address to the victim data logic circuit.

13. The apparatus of claim 9, wherein the reverse scrambler is further configured to provide a plurality of aggressor row addresses associated with at least one of the refresh address or the accessed row address.

14. The apparatus of claim 13, wherein individual ones of the plurality of aggressor row addresses are compared to the row address in series.

15. The apparatus of claim 13, wherein the aggressor row detector further provides a plurality of match signals corresponding to the plurality of aggressor row addresses.

16. The apparatus of claim 13, wherein each of the plurality of aggressor row addresses correspond to word lines having different physical relationships to a word line associated with the refresh address or the accessed row address.

17. A method comprising:
storing a row address in a register;
setting victim data to a first value, wherein the victim data is associated with the row address in the register;
calculating at least one aggressor row address based on a second row address associated with a refresh operation or an access operation;
comparing the row address to the at least one aggressor row address; and
setting the victim data to a second value if the row address matches the at least one aggressor row address.

18. The method of claim 17, further comprising:
storing a count value associated with the row address in the register;
adjusting the count value each time the accessed row address is received;
when the count value reaches a threshold value, calculating at least one victim row address when the victim data is set to the first value; and
refreshing the at least one victim row address during a targeted refresh operation.

19. The method of claim 18, further comprising:
setting the victim data to the second value; and
resetting the count value.

20. The method of claim 17, wherein the victim data comprises a plurality of bits, wherein each bit of the plurality of bits corresponds to a victim word line of a word line associated with the row address.

* * * * *